United States Patent
Kawano et al.

(10) Patent No.: US 10,304,761 B2
(45) Date of Patent: May 28, 2019

(54) SEMICONDUCTOR DEVICE AND ALTERNATOR USING SAME

(71) Applicant: Hitachi Power Semiconductor Device, Ltd., Hitachi-shi, Ibaraki (JP)

(72) Inventors: Kenya Kawano, Tokyo (JP); Tetsuya Ishimaru, Tokyo (JP); Shinichi Kurita, Ibaraki (JP); Takeshi Terakawa, Ibaraki (JP)

(73) Assignee: Hitachi Power Semiconductor Device, Ltd., Hitachi-shi (JP)

( * ) Notice: Subject to any disclaimer, the term of this patent is extended or adjusted under 35 U.S.C. 154(b) by 191 days.

(21) Appl. No.: 15/354,474

(22) Filed: Nov. 17, 2016

(65) Prior Publication Data

US 2017/0141018 A1 May 18, 2017

(30) Foreign Application Priority Data

Nov. 18, 2015 (JP) .................................. 2015-225258

(51) Int. Cl.
*H01L 23/495* (2006.01)
*H01L 23/31* (2006.01)
(Continued)

(52) U.S. Cl.
CPC ...... *H01L 23/49568* (2013.01); *H01L 23/051* (2013.01); *H01L 23/3114* (2013.01);
(Continued)

(58) Field of Classification Search
CPC ............ H01L 23/49568; H01L 23/051; H01L 23/3114; H01L 23/3135; H01L 23/49548;
(Continued)

(56) References Cited

U.S. PATENT DOCUMENTS 5,432,371 A * 7/1995 Denner ............... H01L 27/0251
257/355
6,700,793 B2 * 3/2004 Takagawa ......... H01L 23/49562
257/E23.044
(Continued)

FOREIGN PATENT DOCUMENTS

CN 101304011 A 11/2008
CN 104952815 A 9/2015
(Continued)

OTHER PUBLICATIONS

Extended European Search Report issued in counterpart European Application No. 16199336.5 dated May 26, 2017 (Nine (9) pages).
(Continued)

*Primary Examiner* — Emily P Pham
(74) *Attorney, Agent, or Firm* — Crowell & Moring LLP (57) ABSTRACT

Provided are a semiconductor device realized easily at low cost without requiring a complicated manufacturing process, and an alternator using the same. The semiconductor device includes a base having a base seat, a lead having a lead header, and an electronic circuit body, wherein the electronic circuit body is arranged between the base and the lead; the base seat is connected to a first surface of the electronic circuit body; the lead header is connected to a second surface of the electronic circuit body; the electronic circuit body is integrally covered by resin, including a transistor circuit chip having a switching element, a control circuit chip for controlling the switching element, a drain frame, and a source frame; either one of the drain frame and the source frame, and the base are connected; and the other one of the drain frame and the source frame, and the lead are connected.

8 Claims, 7 Drawing Sheets (51) Int. Cl.
*H02K 11/04* (2016.01)
*H01L 23/051* (2006.01)

(52) U.S. Cl.
CPC .... *H01L 23/3135* (2013.01); *H01L 23/49548* (2013.01); *H01L 23/49562* (2013.01); *H01L 23/49575* (2013.01); *H02K 11/046* (2013.01); *H01L 23/49589* (2013.01); *H01L 2224/01* (2013.01); *H01L 2224/73265* (2013.01)

(58) Field of Classification Search
CPC ......... H01L 23/49562; H01L 23/49575; H01L 23/49589; H01L 2224/01; H01L 2224/73; H02K 11/046
See application file for complete search history.

(56) References Cited

U.S. PATENT DOCUMENTS

| 2006/0044772 | A1 | 3/2006 | Miura | |
|---|---|---|---|---|
| 2006/0220218 | A1* | 10/2006 | Sheen | H01L 23/051 257/697 |
| 2008/0014703 | A1* | 1/2008 | Choi | H01L 21/28061 438/299 |
| 2008/0268577 | A1 | 10/2008 | Kagii et al. | |
| 2008/0277774 | A1 | 11/2008 | Hasegawa | |
| 2011/0318884 | A1 | 12/2011 | Noritake et al. | |
| 2015/0255487 | A1* | 9/2015 | Yoshida | G02F 1/1345 257/43 |
| 2015/0279763 | A1 | 10/2015 | Masunaga et al. | |
| 2016/0072376 | A1* | 3/2016 | Ahlers | H01L 27/0207 310/68 D |
| 2016/0315184 | A1 | 10/2016 | Ishimaru et al. | |

FOREIGN PATENT DOCUMENTS

| JP | 5-326830 A | 12/1993 |
|---|---|---|
| JP | 2001-156225 A | 6/2001 |
| JP | 2015-116053 A | 6/2015 |
| WO | WO 2015/072105 A1 | 5/2015 |
| WO | WO 2015/087997 A1 | 6/2015 |

OTHER PUBLICATIONS

Chinese-language Office Action issued in counterpart Chinese Application No. 201611020685.1 dated Jul. 30, 2018 with partial English translation (thirteen (13) pages).

* cited by examiner

SEMICONDUCTOR DEVICE AND ALTERNATOR USING SAME

CROSS REFERENCE TO RELATED APPLICATION

This application claims the priority of Japanese Patent Application No. 2015-225258, filed on Nov. 18, 2015, the entire specification, claims and drawings of which are incorporated herewith by reference.

BACKGROUND OF THE INVENTION

Field of the Invention

The present invention relates to a semiconductor device and an alternator using the same.

Description of the Related Arts

Related arts of the present technical field are disclosed in Patent Documents 1 to 3.

Patent Document 1 (JP 2015-116053 A) discloses technology for a semiconductor device, with description "[PROBLEM TO BE SOLVED] Presented are a semiconductor device, an alternator, and a power conversion device, which can be simply assembled and have a low loss. [SOLUTION] A semiconductor device S1 according to the present invention includes a first external electrode 101 having an outer circumferential portion 101s in a circular shape in a top view, the external electrode 101 being fitted to an alternator Ot; on the external electrode 101, there are mounted a MOSFET chip 103, a control circuit 104 receiving input voltage or current of the first main terminal 103d and the second main terminal 103s of the MOSFET chip 103 and, based on the input, generating a control signal to be supplied to a gate 103g of the MOSFET chip 103, and a capacitor 105 for supplying power source to the control circuit 104; the semiconductor device S1 includes a second external electrode 107 on the side, of the MOSFET chip 103, opposite to the first external electrode; and the first main terminal 103d of the MOSFET chip 103 and the first external electrode 101, and the second main terminal 103s of the MOSFET chip 103 and the second external electrode 107, are electrically connected. (refer to [Abstract])".

Patent Document 2 (JP 2001-156225 A) discloses technology for a semiconductor device, with description "[PROBLEM TO BE SOLVED] Provided is a semiconductor device, for which thermal radiation and electrical conductivity are improved, and by which different semiconductor chips can be easily housed. [SOLUTION] A pair of thermal radiation members 2, 3 are disposed such as to sandwich Si chips 1a, 1b disposed on a plane, and the main electrodes of the Si chips 1a, 1b and thermal radiation members 2, 3 made from metal with principal component of Cu or Al are electrically and thermally connected through a joint member 4. The thermal radiation member 2 on one surface side is provided with protruding portions 2a corresponding to facing Si chips 1a, 1b, and the tip ends of the protruding portion 2a and the main electrodes are connected. The Si chips 1a, 1b and the thermal radiation members 2, 3 are sealed by resin (refer to [Abstract])".

Further, Patent Document 3 (JP H05-326830 A) discloses technology for a semiconductor device, with description "[PURPOSE] When a container, the container housing a semiconductor element body, for example, such as an IGBT chip, with a main electrode on one entire main surface and a main electrode and a control electrode on the other main surface, is sandwiched between two contact bodies and subjected to press-contact, thermal radiation from the main surface side where the control electrode is present is also made satisfactory. [CONSTITUTION] The main surface having the control electrode of the semiconductor element body is covered by an isolative and thermally conductive gel 8 and an isolative and thermally conductive cast resin 9 on it, and thermal radiation is performed through the gel 8 and the resin layer 9. By sandwiching a plurality of such elements by common contact bodies, heat is transferred to the both contact bodies by conduction and radiation, and a semiconductor device with a small volume and a large electrical capacitance can be obtained. (refer to [Abstract])".

SUMMARY OF THE INVENTION

However, the technologies disclosed in above Patent Documents 1 to 3 have the following problems.

In the semiconductor device by the technology disclosed in Patent Document 1, a MOSFET chip 103, a first external electrode 101, and a second external electrode 107 are directly connected by solder 109 such as to sandwich the MOSFET chip 103. A capacitor 105 is insulated by an insulating substrate 106 from the first external electrode 101 or the second external electrode 107. Accordingly, for example, for the use for the rectifying circuits of an alternator used for power generation of an automobile, it is necessary to manufacture a so-called forward (rectifying element S1) structure and a so-called reverse (rectifying element S2) structure, whose current directions are different, in respective different manufacturing processes, which causes a problem of requiring further improvement in the manufacturing equipment and cost.

Also in the semiconductor device disclosed in Patent Document 2 and the semiconductor element disclosed by Patent Document 3, the structures only include so-called output circuits, and, for example, in using for a rectifying circuit, it is accordingly necessary to additionally arrange a control circuit separately from an output circuit. Consequently, there is a problem that the above structures cannot be an appropriate structure at all, as a structure of a semiconductor device of a rectifying circuit or the like, which is arranged by integral formation of an output circuit and a control circuit and has an external electrode with two terminals.

Further, in the semiconductor device disclosed in Patent Document 2 and the semiconductor element disclosed in Patent Document 3, because the connection between the internal electrode and the external electrode is provided by contact, for example, as a structure of a semiconductor device of a power conversion system, a rectifying circuit or the like accompanied by high heat generation, the structure has a problem of being disadvantageous in a point of view of thermal radiation and electrical resistance, because the contact boundary surface may be opened by thermal deformation during operation.

The present invention has been developed, addressing the above-described problems, and an object of the invention is to provide a semiconductor device and an alternator using the same, which can be easily realized at a low cost, without the necessity of a complicated manufacturing process.

An aspect of the present invention provides a semiconductor device, comprising:

a first external electrode including a first electrode surface portion;

a second external electrode including a second electrode surface portion; and an electronic circuit body including:

a transistor circuit chip including a switching element;

a control circuit chip which controls the switching element;

a first internal electrode in contact with a first main surface of the transistor circuit chip; and a second internal electrode in contact with a second main surface of the transistor circuit chip, wherein the electronic circuit body is disposed between the first external electrode and the second external electrode, wherein the first electrode surface portion is connected to a first surface of the electronic circuit body, wherein the second electrode surface portion is connected to a second surface of the electronic circuit body, wherein the electronic circuit body is integrally covered with a resin, wherein one of the first internal electrode and the second internal electrode is connected with the first external electrode, and wherein the other one of the first internal electrode and the second internal electrode is connected with the second external electrode.

Other aspects of the invention will be described later in embodiments for carrying out the invention.

According to the present invention, it is possible to provide a semiconductor device that can be easily realized without requiring a complicated manufacturing process, and an alternator using the same.

PREFERRED EMBODIMENT OF THE INVENTION

In the following, embodiments for carrying out the present invention will be described, referring to the drawings, as appropriate.

First Embodiment

A semiconductor device (rectifying element) 200 in the first embodiment according to the present invention will be described, referring to FIG. 1 and FIG. 2.

Figure 1:
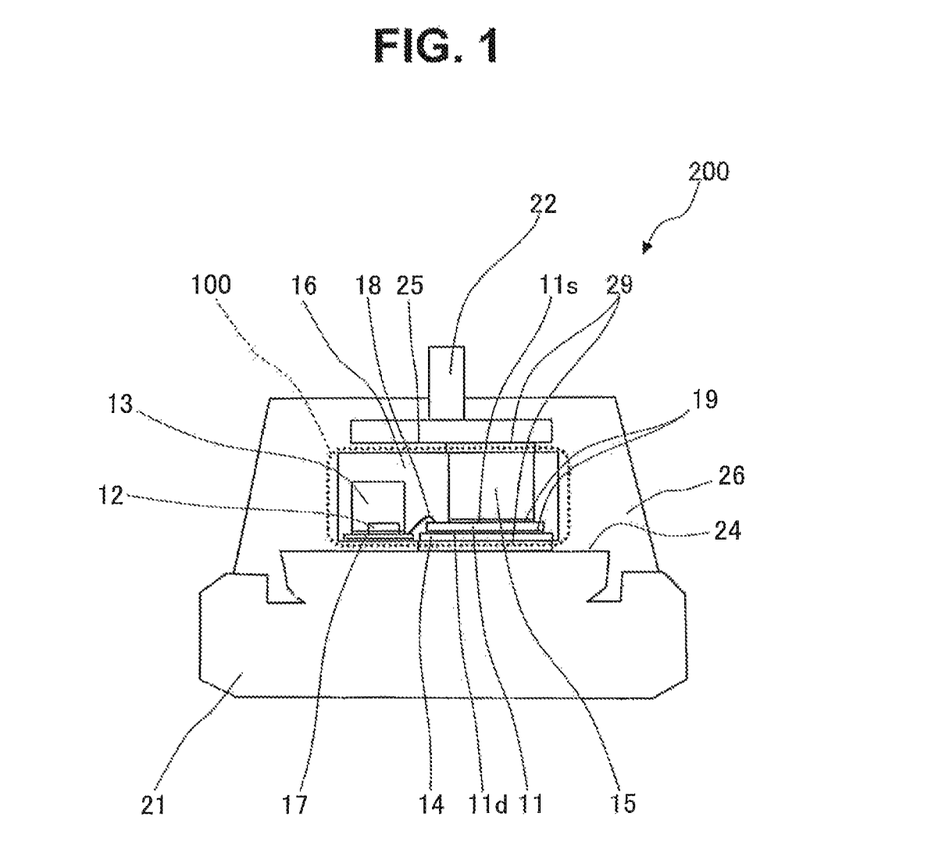
FIG. 1 is a schematic diagram showing the cross-section of the vertical structure of a semiconductor device in a first embodiment according to the present invention.

FIG. 1 is a schematic diagram showing the cross-section of the vertical structure of the semiconductor device 200 in the first embodiment according to the present invention.

Figure 2:
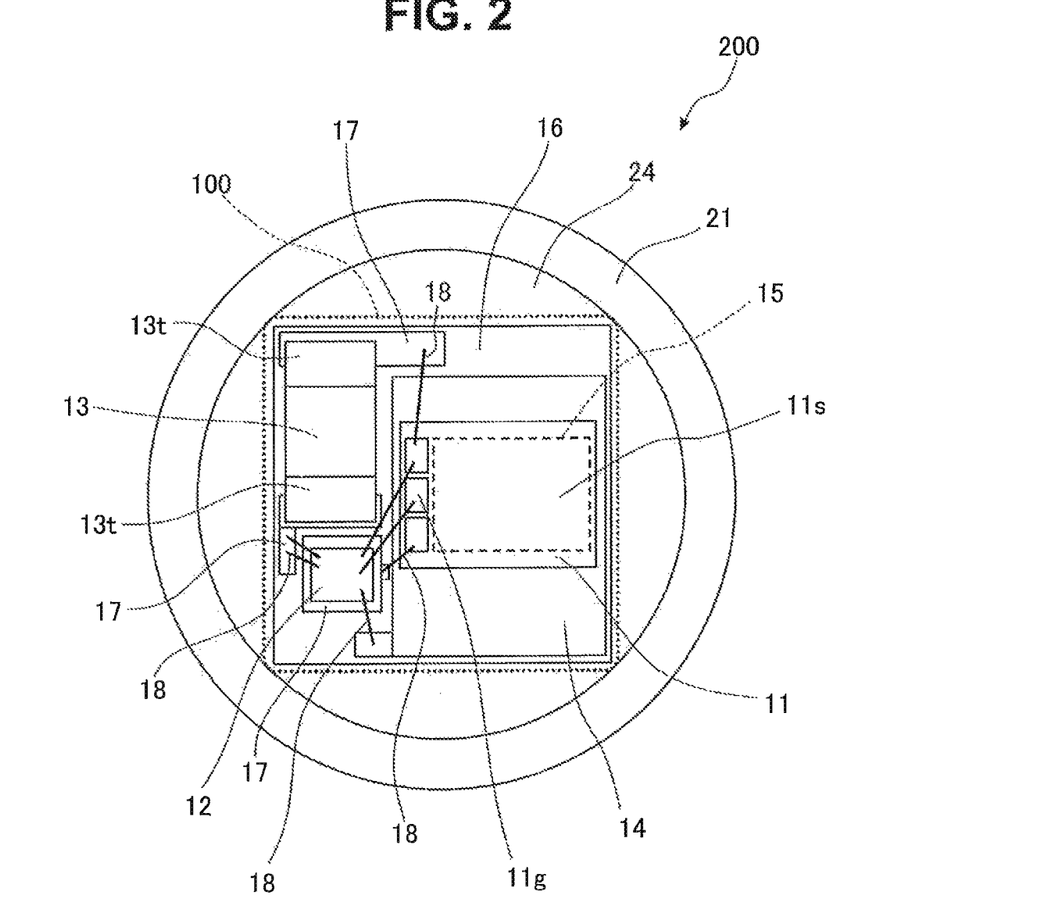
FIG. 2 is a schematic diagram showing the planar structure of the semiconductor device in the first embodiment according to the invention.

FIG. 2 is a schematic diagram showing the planar structure of the semiconductor device 200 in the first embodiment according to the invention. Incidentally, in FIG. 2, for easy understanding, a lead (the second external electrode) 22, a lead header (the second electrode surface portion) 25, and a second resin 26, which are disposed at the upper portion of the semiconductor device 200, are not shown.

Incidentally, as the configuration (structure) of a rectifying element (semiconductor device), there are two configurations (structures) called 'forward configuration' and 'reverse configuration'. The difference between these 'forward configuration' and 'reverse configuration' is discriminated by the difference in the electrical polarity and the difference in the configuration (structure) accompanying it.

The semiconductor device 200 in the first embodiment has a forward structure and will be described below in detail. Further, a reverse semiconductor device 300 (FIG. 7) will be described later as a second embodiment.

Semiconductor Device: No. 1

In FIG. 1 and FIG. 2, the semiconductor device 200 is configured with a base (the first external electrode, the first external terminal) 21 having a base seat (the first electrode surface portion) 24 at its upper portion (upper in the sheet of FIG. 1), a lead (the second external electrode, the second external terminal) 22 having a lead header (the second electrode surface portion) 25 at its lower portion (lower in the sheet of FIG. 1), and an electronic circuit body 100.

The base seat 24 is connected with drain frame (the first internal electrode) 14 of the later-described electronic circuit body 100 through a second conductive joint member (joint member of the semiconductor device) 29.

Further, the lead header 25 is connected with a source frame (the second internal electrode) 15, described later, of the electronic circuit body 100 through the second conductive joint member 29.

Still further, the base seat 24 and a part of the base 21 located at its upper portion, the lead header 25 and a part of the lead 22 located at its lower portion, and the electronic circuit body 100 are covered and sealed by the second resin (resin for a semiconductor device, a mold material) 26.

Incidentally, the base (the first external electrode, the first external terminal)) 21 and the lead (the second external electrode, the second external terminal) 22 function as terminals (external terminals) in electrical connection with an external circuit.

The outline of the configuration of the semiconductor device 200 has been described above.

Electronic Circuit Body

In the following, the detailed configuration of the electronic circuit body 100 of the semiconductor device 200 will be described, referring to FIG. 1 and FIG. 2. Incidentally, in FIG. 1 and FIG. 2, the electronic circuit body 100 is shown by dashed line in order to indicate the region covered by the electronic circuit body 100. Further, in FIG. 2, the electronic circuit body 100 is indicated larger than the electronic circuit body 100 indicated in FIG. 1 in order that the internal configuration thereof can be viewed clearly.

The electronic circuit body 100 shown in FIG. 1 and FIG. 2 is provided with a transistor circuit chip 11, a control circuit chip 12, and a capacitor 13. Further, the electronic circuit body 100 is also provided with the drain frame (the first internal electrode) 14, the source frame (the second electrode) 15, and a lead frame (support body) 17.

The transistor circuit chip 11 is configured, for example, with a MOSFET (Metal-Oxide-Semiconductor Field-Effect Transistor). The drain electrode (the first main terminal) 11*d* and the source electrode (the second main terminal) 11*s* of the MOSFET are arranged on different main surfaces of the transistor circuit chip 11.

The surface on the side where the drain electrode 11*d* of the transistor circuit chip 11 is arranged will be referred to as the first main surface of the transistor circuit chip 11, and the surface on the side where the source electrode 11*s* is arranged will be referred to as the second main surface of the transistor circuit chip 11.

The drain electrode 11*d* is connected with the surface (the first surface) at one end of the drain frame 14, which is the first internal electrode, through a first conductive joint member (joint member of the electronic circuit body) 19.

The source electrode 11*s* is connected with the surface (the first surface) at one end of the source frame 15, which is the second internal electrode, through the first conductive joint member 19.

The control circuit chip 12 is connected with the upper end of the lead frame 17, which is a support body, through the first conductive joint member 19.

Further, the capacitor 13 supplying power source to the control circuit chip 12 is also connected with the upper end of the lead frame 17 through the first conductive joint member 19.

The other surface (the second surface) of the drain frame 14 is exposed from the first surface of the electronic circuit body 100 to contact with the base seat 24 through the second conductive joint member (a joint member for a semiconductor device) 29.

The other end surface (the second surface) of the source frame 15 is exposed from the second surface of the electronic circuit body 100 to contact with the lead header 25 through the second conductive joint member (a joint member of the semiconductor device) 29.

Incidentally, the lead frame 17 is disposed such as to electrically isolate from the base 21, in other words, the base seat 24.

The control circuit chip 12 is electrically connected with the transistor circuit chip 11 through a wire 18. For example, if the transistor circuit chip 11 is a power MOSFET, a gate electrode 11*g* formed on the transistor circuit chip 11 and the control circuit chip 12 are connected by the wire 18 to control the gate voltage of the power MOSFET by the control circuit chip 12. It is thereby possible to make a high current flow in the transistor circuit chip 11 having a switching function.

Further, the capacitor 13 is electrically connected with the transistor circuit chip 11 and the control circuit chip 12 by the lead frame 17 or the wire 18. The two capacitor terminals 13*t* shown in FIG. 2 are the both terminals of the capacitor 13. For example, a ceramic capacitor can be used as the capacitor 13.

The transistor circuit chip 11 has a function for switching a high current.

As the transistor circuit chip (switching circuit chip) 11 having a function for switching, for example, a semiconductor element provided with an IGBT (Insulated Gate Bipolar Transistor) and a power MOSFET can be adopted. Further, as the transistor circuit chip 11, a semiconductor element, made of Si, SiC, SiN and GaAs, etc., provided with a semiconductor element for control ON-OFF of a high current of a thyristor or the like may be adopted.

Further, the control circuit chip 12 is a semiconductor element for controlling the transistor circuit chip 11 for switching high current. The control circuit chip 12 itself is a semiconductor element that does not include a semiconductor element for switching high current.

That is, the control circuit chip 12 is a semiconductor element provided with plural circuit including a logic circuit, an analog circuit, a driver circuit, etc., and is provided with a microprocessor and the like, as necessary. Further, the control circuit chip 12 can also have a function to control high current flowing into the transistor circuit chip 11.

Incidentally, an example of circuit configuration of the transistor circuit chip 11 and the control circuit chip 12 will be descried later, referring to FIG. 5 and FIG. 6.

Further, the transistor circuit chip 11, the control circuit chip 12, the capacitor 13, the drain frame 14, the source frame 15, and the first conductive joint member 19 are integrally covered and sealed by a first resin (resin of the electronic circuit body, mold material) 16, and the integrated electronic circuit body 100 is thereby configured.

Incidentally, the side, where the drain frame 14 and the lead frame 17 are disposed, of the electronic circuit body 100 will be referred to as the first surface, and the opposite side, in other words, the side where a part of the source frame 15 is exposed, will be referred to as the second surface.

Semiconductor Device: No. 2

Again, the configuration of the semiconductor device 200 will be described in detail.

As described above, the base seat (the first electrode surface portion) 24, a part of the base (the first external electrode) 21, the part being located at the upper portion (upper in the sheet of FIG. 1) of the base 21, the lead header (the second electrode surface portion) 25, a part of the lead (the second external terminal) 22, the part being located at the lower portion (lower in the sheet of FIG. 1) of the lead 22, the second conductive joint member 29, and the electronic circuit body 100 are covered and sealed by the second resin (resin for a semiconductor device) 26 to configure the semiconductor device 200.

The connection portion between the upper surface of the source frame 15 of the electronic circuit body 100 and the lead header 25, and the connection portion between the lower surface of the drain frame 14 of the electronic circuit body 100 and the base seat 24 will be described, referring to FIG. 3 and FIG. 4.

Figure 3:
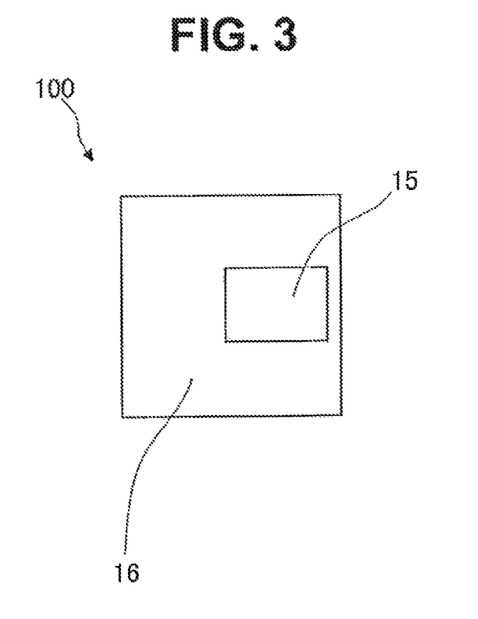
FIG. 3 is a schematic diagram showing the upper surface of the electronic circuit body of the semiconductor device in the first embodiment according to the invention.

FIG. 3 is a schematic diagram showing the upper surface (upper in the sheet of FIG. 1) of the electronic circuit body of the semiconductor device in the first embodiment according to the invention.

In FIG. 3, the upper surface of the source frame 15 of the electronic circuit body 100 is not covered by the first resin 16 of the electronic circuit body 100 but is exposed on the surface of the electronic circuit body 100.

Accordingly, the upper surface of the source frame 15 of the electronic circuit body 100 can be electrically connected with the lead header 25 (FIG. 1) through the second conductive joint member 29 (FIG. 1).

Figure 4:
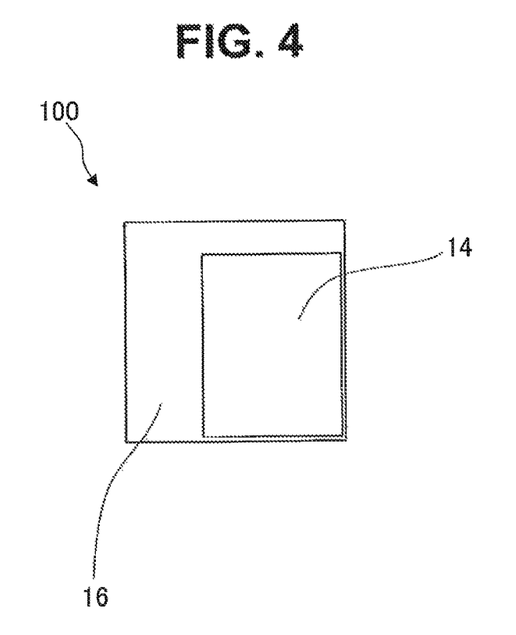
FIG. 4 is a schematic diagram showing the lower surface of the electronic circuit body of the semiconductor device in the first embodiment according to the invention.

FIG. 4 is a schematic diagram showing the lower surface (lower in the sheet of FIG. 1) of the electronic circuit body of the semiconductor device in the first embodiment according to the invention.

In FIG. 4, the lower surface of the drain frame 14 of the electronic circuit body 100 is not covered by the first resin 16 of the electronic circuit body 100 but is exposed on the surface of the electronic circuit body 100.

Accordingly, the lower surface of the drain frame 14 of the electronic circuit body 100 can be electrically connected with the base seat 24 (FIG. 1) through the second conductive joint member 29 (FIG. 1).

In such a manner, in FIG. 1, the drain frame 14 is connected to the base seat 24 through the second conductive joint member 29.

Further, the source frame 15 is connected to the lead header 25 through the second conductive joint member 29.

As described above, the electronic circuit body 100 is sealed by the first resin 16 and integrally arranged in a structure where the drain frame 14 and one surface of the source frame 15 are, as shown in FIG. 3 and FIG. 4, respectively exposed on the surface of the electronic circuit body 100.

The exposed one surface of the drain frame 14 is electrically connected to the base seat 24 of the base 21, the exposed one surface of the source frame 15 is connected to the lead header 25 of the lead 22, respectively by the second conductive joint member 29, and the semiconductor device 200 is thus structured.

In this structure, the thickness of the source frame 15 connected with the source electrode 11s of the transistor circuit chip 11 is made larger than the thickness of the drain frame 14. Herein, making the thickness large means making the thickness along the direction from the base seat 24 toward the lead header 25 large.

By making the thickness in such a manner, generated heat accompanying the loss, which is caused when a current flows in the source electrode 11s, can be efficiently radiated to the source frame 15 side so that the cooling performance of the semiconductor device 200 can be improved.

That is, for the transistor circuit chip 11, as a transistor element is formed mainly on the surface on the side where the source electrode 11s is formed, heat generation by the transistor element occurs mainly on the side where the source electrode 11s is formed. Accordingly, it is more effective if heat radiation is carried out by the source frame 15. In order to radiate heat by the source frame 15, making the heat capacity of the source frame 15 large and making the heat transfer satisfactory is effective, and for this purpose, the thickness of the source frame 15 is, as described above, made larger than that of the drain frame 14.

Further, by making the thickness of the source frame 15 large, the source frame 15 can have the conductor exposed on the lead header 25 side of the electronic circuit body 100. In such a manner, a structure enabling connection of the source frame 15 with the lead header 25, namely the lead 22, is arranged.

Example of Circuit Configuration of Forward Semiconductor Device

In the following, an example of a circuit configuration using the semiconductor device (forward) 200 will be described.

Figure 5:
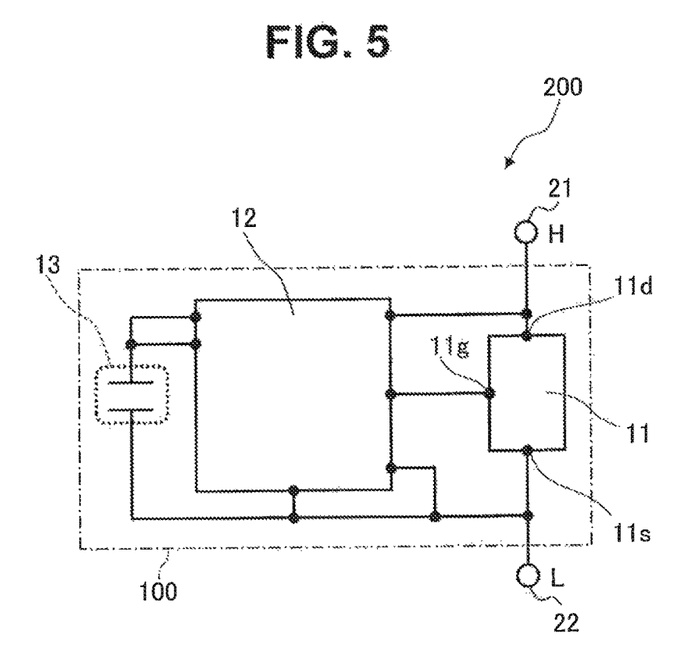
FIG. 5 is a diagram showing an example of the circuit configuration of a rectifying circuit using the semiconductor device in the first embodiment according to the invention.

FIG. 5 is a diagram showing an example of the circuit configuration of a rectifying circuit using the semiconductor device 200 in the first embodiment according to the invention.

In FIG. 5, the semiconductor device 200 is configured with the electronic circuit body 100, in other words, including the transistor circuit chip 11 having a switching function, the control circuit chip 12, and the capacitor 13. The H-terminal is the base 21 in FIG. 1, and the L-terminal is the lead 22 in FIG. 1.

For example, in a case of a rectifying element of a rectifying circuit of an alternator used for power generation for an automobile, the H-terminal is connected to a battery, and the L-terminal is connected to a coil for power generation. The transistor circuit chip 11, the control circuit chip 12, and the capacitor 13 of the electronic circuit body 100 having been described with reference to FIGS. 1 to 4 are wired and electrically connected as shown in FIG. 5.

Concretely, a current having flowed from a coil (not shown) of a generator (see FIG. 10) flows through the L-terminal (the lead 22) into the source electrode 11s of the transistor circuit chip 11 having a switching function.

Further, the above current flows into the control circuit chip 12, and the control circuit chip 12 controls the gate voltage to increase the voltage of the gate electrode 11g of the transistor circuit chip 11 to make a current flow from the drain electrode 11d of the transistor circuit chip 11 through the H-terminal (the base 21) to a battery (not shown).

The control circuit chip 12 is supplied with a power source and driven, wherein the power source (power, voltage) is supplied by electrical charge accumulated by the capacitor 13 from the current having flowed in from the L-terminal (the lead 22).

Concrete Example of Circuit Configuration of Electronic Circuit Body

In the following, a concrete example of the circuit configuration of the electronic circuit body 100 will be described.

Figure 6:
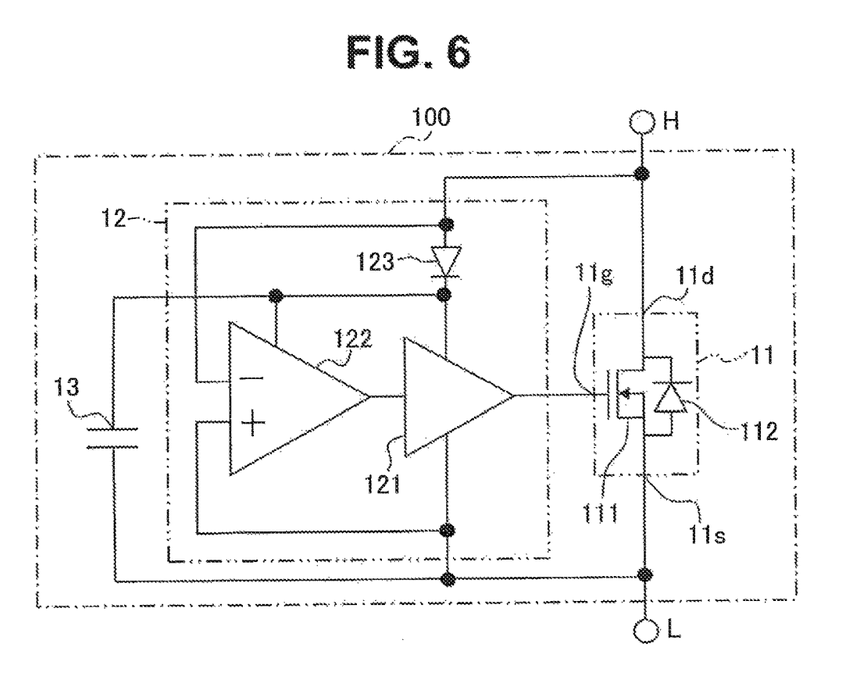
FIG. 6 is a diagram showing an example of a more detailed circuit configuration of the semiconductor device and the electronic circuit body in the first embodiment according to the invention.

FIG. 6 is a diagram showing an example of a more detailed circuit configuration of the semiconductor device 200 and the electronic circuit body 100 in the first embodiment according to the invention.

In FIG. 6, between the H-terminal and the L-terminal, wired as described above and electrically connected are the transistor circuit chip 11, the control circuit chip 12, and the capacitor 13, which have been described with reference to FIG. 5.

The transistor circuit chip 11 is provided with a MOSFET 111.

The MOSFET 111 is an n-type channel (n-type) and includes a diode 112 in reverse-parallel as a parasitic diode.

The control circuit chip 12 is provided with a comparator 122 for comparison between the voltage of the L-terminal and the voltage of the H-terminal, a gate driver 121 for applying voltage to the gate electrode 11g of the MOSFET 111, and a diode 123 for preventing reverse flow.

The inverted input terminal (−) of the comparator 122 is connected to the H-terminal, and the non-inverting input terminal (+) of the comparator 122 is connected to the L-terminal.

The output terminal of the comparator 122 is connected to the input terminal of the gate driver 121.

The output terminal of the gate driver 121 is connected to the gate electrode 11g of the MOSFET 111.

Further, the high-voltage side terminal of the capacitor 13 is connected to the power source terminal of the comparator 122 and the power source terminal of the gate driver 121. The low-voltage side terminal of the capacitor 13 is connected to the L-terminal.

The anode of the diode 123 for preventing reverse flow is connected to the H-terminal. The cathode of the diode 123 is, as described above, connected to the power source terminal of the gate driver 121, the power source terminal of the comparator 122, and the high-voltage side terminal of the capacitor 13.

Operation of Circuit of Semiconductor Device 200

The operation of the circuit of the semiconductor device 200 and the electronic circuit body 100, shown in FIG. 6, will be described below.

When the voltage of the H-terminal becomes lower than the voltage of the L-terminal, the comparator 122 outputs a high-voltage signal to the gate driver 121.

The gate driver 121 having received the input of high-voltage signal increases the voltage of the gate electrode 11g of the MOSFET 111 to turn the MOSFET (the transistor circuit chip 11) into ON state.

Conversely, when the voltage of the H-terminal has become higher than the voltage of the L-terminal, the comparator 122 outputs a signal of low voltage to the gate driver 121.

The gate driver 121 having received the input of the signal of low voltage decreases the voltage of the gate electrode 11g of the MOSFET 111 (the transistor circuit chip 11) to turn the MOSFET 111 (the transistor circuit chip 11) into OFF state.

That is, the comparator 122 compares the voltage of the H-terminal and the voltage of the L-terminal with respect to the magnitude relationship, and then the gate driver 121 turns ON/OFF of the MOSFET 111 (the transistor circuit chip 11). In other words, operation as a rectifying element is performed.

Incidentally, the capacitor 13 in FIG. 6 plays the role of supplying power source voltage (power) to the comparator 122 and the gate driver 121, depending on the accumulated charge.

Advantageous Effects of First Embodiment

The semiconductor device 200 in the first embodiment according to the present invention has, as described above, a structure that the integrated electronic circuit body 100 is sandwiched between the base 21 having the base seat 24 and the lead 22 having the lead header 25. Accordingly, as testing can be carried out at the stage of the integrated electronic circuit body 100, it is possible to improve test and selectivity, improve yield, and reduce yield cost.

Further, as the structure is simple as described above, there is also such an advantage that reduction of the manufacturing cost of a semiconductor device, simplification of the assembling process, and downsizing are possible.

Figure 9:
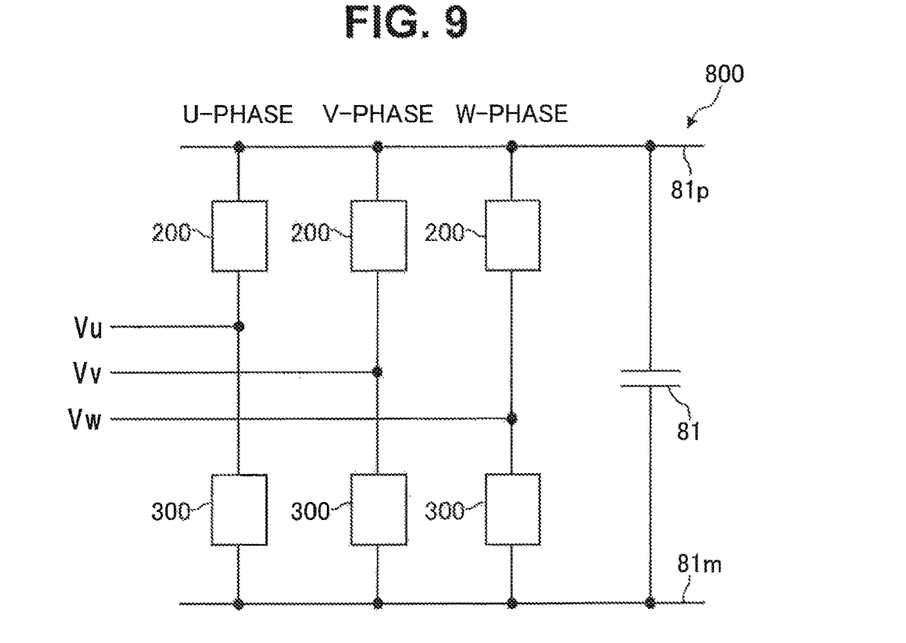
FIG. 9 is a diagram showing an example of the circuit configuration of a three-phase full-wave rectification circuit device using a forward semiconductor device and a reverse semiconductor device.

Incidentally, the semiconductor device 200 in the first embodiment has, as described above, a forward structure, and the semiconductor device 300 in a second embodiment described later has a reverse structure. For such a forward semiconductor device and a reverse semiconductor device, an electronic circuit body 100 can be shared, and this makes an excellent feature and advantage of the present invention. In this situation, description will be made first on the semiconductor device 300 in the second embodiment and an example of application (a three-phase full-wave rectification circuit device 800: FIG. 9), and then advantages will be again described.

Second Embodiment

The semiconductor device 300 in the second embodiment according to the present invention will be described below, referring to FIG. 7. Incidentally, the semiconductor device 300 in the second embodiment has a reverse structure.

Figure 7:
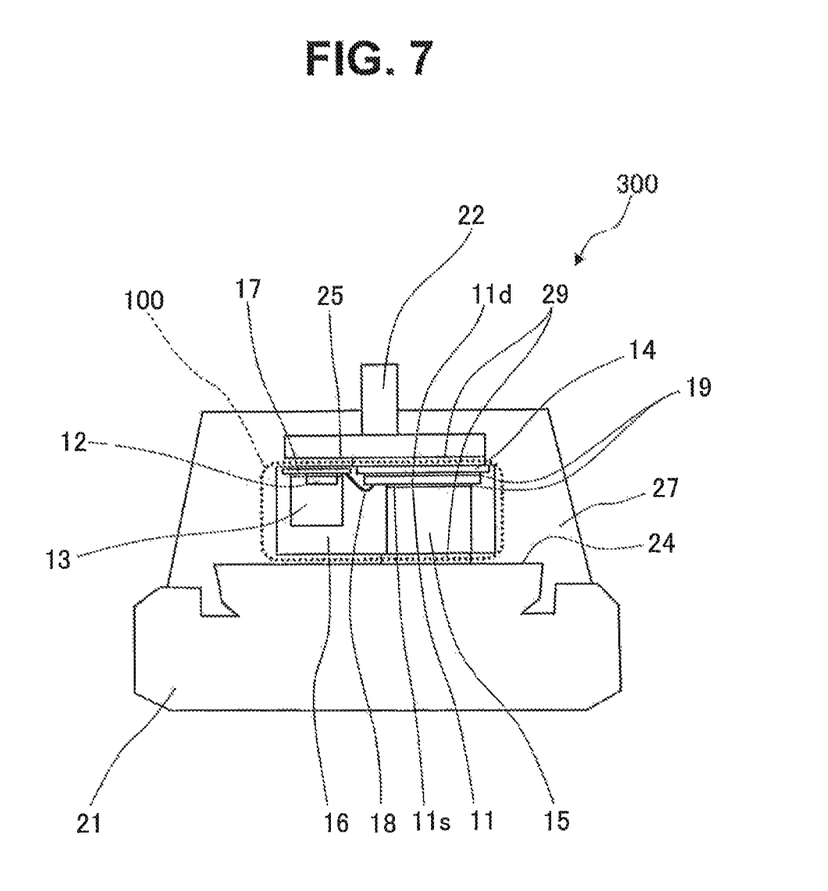
FIG. 7 is a schematic diagram showing the cross-section of the vertical structure of a semiconductor device in a second embodiment according to the invention.

FIG. 7 is a schematic diagram showing the cross-section of the vertical structure of the semiconductor device 300 in the second embodiment according to the invention.

In FIG. 7, the semiconductor device 300 is different from the semiconductor device 200 in FIG. 1 in the upper and lower direction and connection relationship in which a base 21 having a base seat 24 at its upper portion, a lead 22 having a lead header 25 at its lower portion, and an electronic circuit body 100 are provided. In other points, as elements and a structure common with those in the first embodiment are adopted, overlapping description will be omitted, as appropriate.

In the following, description will be made mainly on matters in which the (reverse) semiconductor device 300 in the second embodiment is different from the (forward) semiconductor device 200 in the first embodiment.

Forward Semiconductor Device

The semiconductor device 200 in the first embodiment described with reference to FIGS. 1 to 5 is, as described above, a rectifying element used for the upper arm of a rectifying circuit, called a forward rectifying circuit, of an alternator.

As shown in FIG. 1, the drain electrode 11d of the transistor circuit chip 11 is connected to the base 21, in other words, the base seat 24, and the source electrode 11s of the transistor circuit chip 11 is connected to the lead 22, in other words, the lead header 25.

Reverse Semiconductor Device

In contrast, the semiconductor device 300, which will be described with reference to FIG. 7, in the second embodiment according to the invention is a rectifying element used for the lower arm of a rectifying circuit, called a reverse rectifying circuit, of an alternator.

As shown in FIG. 7, the drain electrode 11d of the transistor circuit chip 11 is connected to the lead 22, in other words, the lead header 25, and the source electrode 11s of the transistor circuit chip 11 is connected to the base 21, in other words, the base seat 24. By this structure, the semiconductor device 300, which is a reverse rectifying element, can be realized.

As described above, the elements for configuration of the semiconductor device 300 shown in FIG. 7 are basically the same as those of the semiconductor device 200 in the first embodiment shown in FIGS. 1 to 5.

As shown in FIG. 7, the semiconductor device 300 is structured by reversing up and down the electronic circuit body 100 of the semiconductor device 200 in the first embodiment shown in FIG. 1, In other words, by reversing up and down and thus using the electronic circuit body 100, it is possible to discriminate the use of forward direction and reverse direction.

That is, the semiconductor device 200 in the first embodiment and the semiconductor device 300 in the second embodiment are configured with the same components and the same circuit configuration, and it is thereby possible to reduce design cost and development cost.

Further, as the electronic circuit body 100 can be manufactured in one manufacturing process, it is possible to greatly reduce the cost of manufacturing equipment and testing equipment.

Further, as test and selection is possible in the state of the electronic circuit body 100, it is possible to greatly reduce yield cost.

Example of Circuit Configuration of Reverse Semiconductor Device

Figure 8:
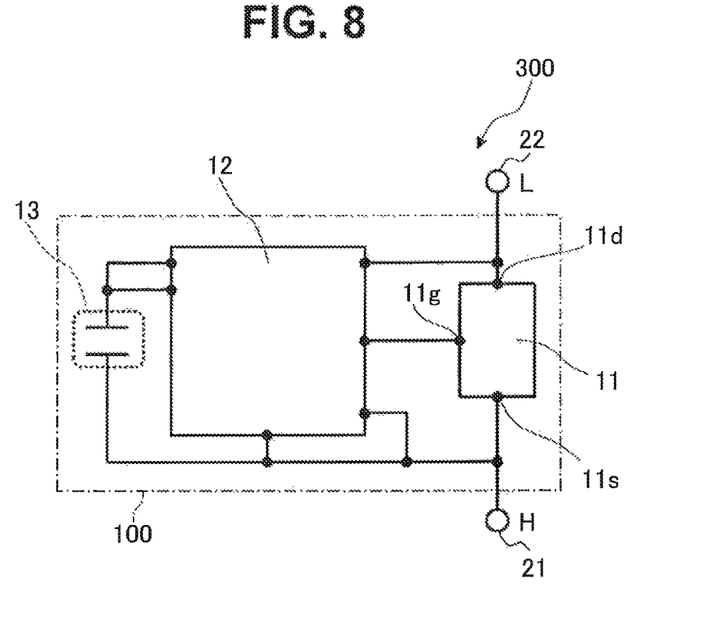
FIG. 8 is a diagram showing an example of the circuit configuration of a rectifying circuit using the semiconductor device in the second embodiment according to the invention.

FIG. 8 is a diagram showing an example of the circuit configuration of a rectifying circuit using the semiconductor device 300 in the second embodiment according to the invention. As described above, the semiconductor device 300 is a reverse semiconductor device.

In FIG. 8, the reverse semiconductor device 300 is provided with the transistor circuit chip 11 having a switching function, the control circuit chip 12, and the capacitor 13.

Herein, the transistor circuit chip 11, the control circuit chip 12, and the capacitor 13 are provided to the electronic circuit body 100.

The electronic circuit body 100 in FIG. 8 has the same configuration as the electronic circuit body 100 of the forward semiconductor device 200 in FIG. 5.

Accordingly, in the semiconductor device 300, the external terminal H (21) connected to the source electrode 11s of the transistor circuit chip 11 is the base 21, and the external terminal L (22) connected to the drain electrode 11d is the lead 22.

In such a manner, for the source electrode 11s and the drain electrode 11d of the transistor circuit chip 11 having a switching function, the connection between the base 21 and the lead 22 is reversed between the semiconductor device 300 and the semiconductor device 200, and the characteristics as a rectifier (rectifying element) accordingly become reverse.

Advantageous Effects of Second Embodiment

Similarly to the semiconductor device 200, the semiconductor device 300 in the second embodiment according to the present invention has such a structure that the integrated electronic circuit body 100 is sandwiched between the base 21 having the base seat 24 and the lead 22 having the lead header 25. Accordingly, test can be carried out at the stage of the integrated electronic circuit body 100, which enables improvement of test and selectivity, improvement of yield, and reduction of yield cost. Further, as the structure is simple as described above, there is an advantageous effect in reduction of manufacturing cost of a semiconductor device, simplification of the assembling process, and downsizing.

Incidentally, the semiconductor device 300 in the second embodiment has a reverse structure, which enables sharing of the electronic circuit body 100 with the forward semiconductor device 200 in the first embodiment, and this makes an excellent feature and advantage of the present invention. In this situation, description will be made first on an example of application (a three-phase full-wave rectification circuit device 800: FIG. 9) of the forward semiconductor device 200 and the reverse semiconductor device 300, and then the advantageous effects will be again described.

Circuit Configuration of Three-phase Full-wave Rectification Circuit Device

FIG. 9 is a diagram showing an example of the circuit configuration of the three-phase full-wave rectification circuit device 800 using forward semiconductor devices 200 and reverse semiconductor devices 300.

In FIG. 9, three forward semiconductor devices 200, three reverse semiconductor devices 300, and a capacitor 81 are provided. Incidentally, the semiconductor devices 200 or the semiconductor devices 300 will be referred to as the first, the second, and the third semiconductor device 200 or semiconductor device 300 in the order from the left side of the sheet.

The first forward semiconductor device 200 and the first reverse semiconductor device 300 are serially connected, and are connected to the terminals (81p, 81m) at the both ends of the capacitor 81. Concretely, the L-terminal of the forward semiconductor device 200 and the H-terminal of the reverse semiconductor device 300 are connected; the H-terminal of the semiconductor device 200 is connected to the terminal 81p of the capacitor 81; and the L-terminal of the semiconductor device 300 is connected to the terminal 81m of the capacitor 81.

The second forward semiconductor device 200 and the second reverse semiconductor device 300 are serially connected, and are connected to the terminals 81p, 81m at the both ends of the capacitor 81.

The third forward semiconductor device 200 and the third reverse semiconductor device 300 are serially connected, and are connected to the terminals 81p, 81m at the both ends of the capacitor 81.

Further, to the connection point between the first forward semiconductor device 200 and the first reverse semiconductor device 300, to the connection point between the second forward semiconductor device 200 and the second reverse semiconductor device 300, and to the connection point between the third forward semiconductor device 200 and the third reverse semiconductor device 300, U-phase (Vu), V-phase (Vv), and W-phase (Vw) of three-phase AC power (voltage) are respectively input.

In this circuit configuration, the three-phase full-wave rectification circuit device 800 performs full-wave rectification of a three-phase AC power (voltage) with U-phase (Vu), V-phase (Vv), and W-phase (Vw) and supplies a DC power (voltage) to the capacitor 81.

In the three-phase full-wave rectification circuit device 800 in FIG. 9, respectively three forward semiconductor devices 200 and three reverse semiconductor devices 300 are used, and the same electronic circuit body is used for each of the forward semiconductor devices 200 and the reverse semiconductor devices 300. Accordingly, variation in electrical characteristics is small, and low manufacturing cost is attained.

From the above, as a rectifying element of a rectifying circuit of an alternator, as described above, for example, used for power generation for an automobile, the three-phase full-wave rectification circuit device 800 in FIG. 9 is extremely suitable in viewpoints of manufacturing cost, characteristic aspect, downsizing, heat radiation, and the like.

Advantageous Effect of Semiconductor Devices in First Embodiment (Forward) and Second Embodiment (Reverse)

In the above, the forward semiconductor device 200 in the first embodiment and the reverse semiconductor device 300 in the second embodiment have been individually described. The advantageous effect of sharing an electronic circuit body 100 for forward and reverse semiconductor devices will be further described below. The advantageous effect common to the first embodiment and the second embodiment will also be further described.

As described above, the forward semiconductor device 200 in the first embodiment and the reverse semiconductor device 300 in the second embodiment are provided with the same electronic circuit body 100.

The electronic circuit body 100 is mainly featured in that the electronic circuit body 100 is provided with the transistor circuit chip 11, the control circuit chip 12, the capacitor 13, the drain frame 14, the source frame 15, and the first conductive joint member 19; is in an integrated structure; and the electrodes of the drain frame 14 and the source frame 15 are taken out individually and respectively from either of the upper and lower directions of the electronic circuit body 100.

Because of this configuration and structure, a single electronic circuit body 100 can be used either for forward direction or reverse direction.

Accordingly, as it is not necessary to discriminate electronic circuit bodies 100 used for a forward and reverse semiconductor devices, manufactured in the same manufacturing process is possible. That is, manufacturing equipment can be shared, the assembling process can be simplified, and manufacturing of a large quantity is possible, which makes an advantage in cost.

Further, in the state of the electronic circuit body 100, selection and test can be carried out, for example using a usual socket, so that the cost for test can be reduced.

Further, as test can be carried out in the state of the electronic circuit body 100 at a stage prior to assembling the semiconductor devices (200, 300), in case that an electronic circuit body 100 has a defect, additional cost of subsequent processes can be avoided. Accordingly, the yield cost can be greatly reduced, and the yield itself can also be improved.

The drain frame 14 exposed on the surface of the electronic circuit body 100 and the internal electrode of the source frame 15 are connected, and the base 21, in other words the base seat 24, and the lead 22, in other words the lead header 25, are connected, by the second conductive joint member 29. It is thereby possible to greatly reduce the electrical resistance.

Further, as described above, by making the thickness of the source frame 15 connected with the source electrode 11s of the transistor circuit chip 11 larger than the thickness of the drain frame 14, it is possible to efficiently radiate, to the source frame 15 side, the generated heat accompanying loss caused when a current flows in the source electrode 11s. Thus, it is possible to improve the cooling performance of the semiconductor devices 200, 300.

That is, according to the embodiments disclosed by the present application, in a case of a rectifying circuit or the like with semiconductor devices (particularly used for an alternator used to generate power for an automobile) having two terminals of external electrodes, it is possible to realize reduction of the manufacturing cost of a semiconductor device, improvement of test and selectivity, simplification of an assembling process, downsizing, and high heat radiation. Particularly, a complicated manufacturing process is not necessary for forward direction and reverse direction, and a manufacturing process can be extremely easily realized.

Other Embodiments

The present invention is not limited to the above-described embodiments, and covers further various modifications. For example, the above-described embodiments have been described in detail fir easy understanding of the invention, but are not necessarily limited to those provided with all the structures described above. Further, a part of the structure of a certain embodiment can be replaced by a part of the structure of another embodiment, and further, it is also possible to add a part or total of the structure of another embodiment to the structure of a certain embodiment.

Other embodiments and modification examples will be further described below.

Material for Mold Material

Regarding the semiconductor device 200 in the first embodiment, the first resin 16 and the second resin 26 were both expressed as mold. If further described, the first resin 16 and the second resin 26 may be of the same material or may be different materials.

However, by the use of usual mold material, such as epoxy resin, biphenyl resin, unsaturated polyester resin, or the like, manufacturing cost can be reduced.

Transfer Molding Process Using Mold

In the description of the first embodiment, the electronic circuit body was sealed by resin, however, the invention is not limited to this process.

For example, by forming an electronic circuit body, for example, by a transfer molding process using a mold, mass-production at a low cost is possible.

Further, it is not always necessary to seal by a resin, and the electronic circuit body 100 may be integrally formed with metal or the like.

Herein, by adopting a MAP (Molded Array Process) in which plural electronic circuit bodies 100 are molded in a single mold cavity, and subjected to cut-forming to be made into individual small pieces, a further advantage in mass-production and cost can be obtained.

Further, by integrally forming the drain frame 14 and the lead frame 17 in advance, and electrically separating in cut-forming after molding, mass-production at even lower cost is possible Herein, by performing half-etching or folding processing, the part of the lead frame 17 is not exposed on the surface of the electronic circuit body 100 and can be insulated from the base 21.

Accordingly, the lead frame 17 is not exposed on the surface of the electronic circuit body 100, however, as one portion of the lead frame 17 is cut by cut-forming, the one portion of the lead frame 17 is exposed on the cut-surface.

By using the one portion, exposed on this cut-surface, of the lead frame 17, it is possible by the use of, for example, a socket to check the control circuit chip 12 and the capacitor 13 in the state of the electronic circuit body 100. Test and selection thereby become easy, and yield improvement and cost reduction can be realized.

First Conductive Joint Member and Second Conductive Joint Member

In the first embodiment, the first and the second conductive joint members have been described, however, the materials of these conductive joint member are not limited to a particular material.

The first conductive joint member 19 and the second conductive joint member 29 may be made from the same material or from different materials. However, the materials are, for example, solder, which is a common electrically conductive joint material, metal containing Au, Ag, or Cu, conductive adhesive agent or the like.

Incidentally, as solder, common eutectic solder, lead-free solder, or the like is used. As a conductive adhesive agent, a resin containing a metal filler such as Ag, Cu, and Ni, or metal alone is used.

Material of Base, Lead, and Frame

In the description of the first embodiment and the second embodiment, the materials of the base 21, the lead 22, and the frames were omitted. These materials will be described below.

For the base 21, the lead 22, the drain frame 14, the source frame 15, and the lead frame 17, a common metal such as Cu or Al, which are easily processed and excellent in heat conductivity and electrical conductivity is used. Herein, it is desirable that plating with Au, Pd, Ag, Ni, or the like is carried out at the connection portion with an electrical conductive joint member.

Configuration of Control Circuit Chip

The circuit described in the first embodiment and shown in FIG. 6 is an example of the circuit configuration of the control circuit chip 12 implementing the semiconductor device (rectifying element) 200 according to the invention, and the circuit configuration is not limited thereto.

Instead of the comparator 122, a differential amplifier that detects the difference in an input signal and amplifies it may be used, and ON/OFF may be controlled by the direction of current flowing in the MOSFET 111.

Further, instead of the capacitor 13 shown in FIG. 5 and FIG. 6, a power source may be supplied from outside.

Transistor Circuit Chip and Control Circuit Chip

Referring to FIG. 1 and FIG. 2, it was described that the transistor circuit chip 11 and the control circuit chip 12 are different chips, however, the transistor circuit chip 11 and the control circuit chip 12 may be formed as a single chip.

Further, if the transistor circuit chip 11 and the control circuit chip 12 are different chips, in FIG. 6, the transistor circuit chip 11 was represented by a MOSFET, however, as described above, the transistor circuit chip 11 may be an IGBT. Incidentally, if the transistor circuit chip 11 is implemented by an IGBT, the first main terminal 11d is the collector terminal and the second main terminal 11s is the emitter terminal.

Capacitor

In the first embodiment, the capacitor 13 shown in FIG. 1, FIG. 5, and FIG. 6 was described as a ceramic capacitor as an example, however, the capacitor 13 is not limited thereto. It is also possible to use a polyester capacitor (mylar capacitor), a polystyrene capacitor, a mica-capacitor, a tantalum-capacitor, or the like. Further, an electrolytic capacitor may be concurrently used.

Application of Semiconductor Device (Rectifying Element)

In FIG. 9, the three-phase full-wave rectification circuit device 800 was shown as an example of a circuit configuration using the semiconductor devices 200 and 300, however, the invention is not limited thereto. Semiconductor devices 200 and 300 may be applied to a full-wave rectification circuit device in a single phase or more than three phases.

Further, an example using the three-phase full-wave rectification circuit device 800 as the rectifying element of the rectifying circuit of an alternator used for power generation for automobile was described, however, the application is not limited to alternators. Application to rectifying elements with various purposes including current conversion devices for industrial purposes can be made.

Alternator

Figure 10:
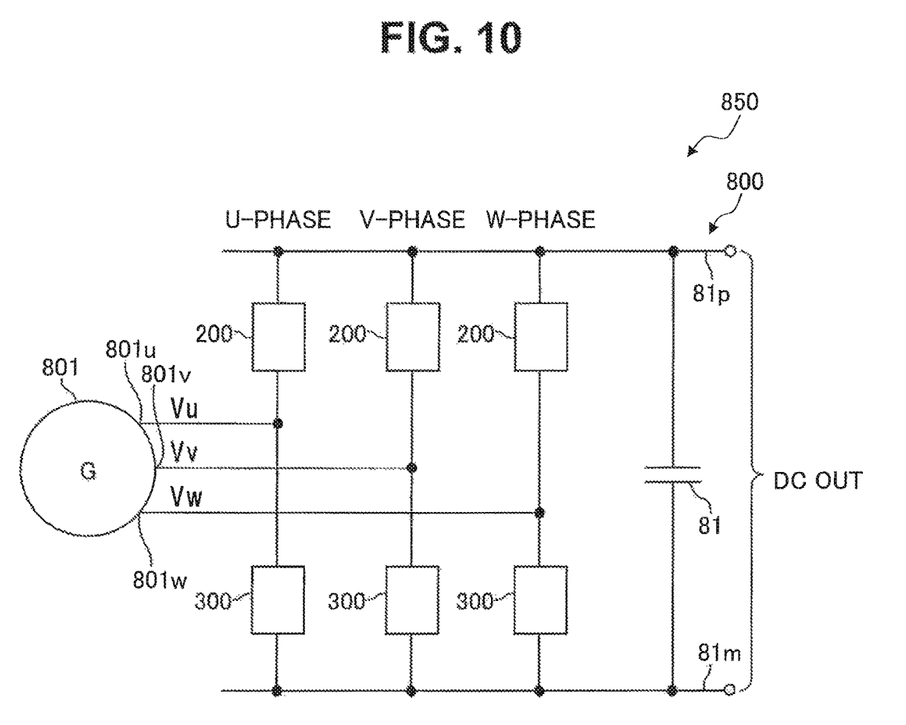
FIG. 10 is a diagram showing a circuit configuration of of an Alternator using the semiconductor device according to the second embodiment of the invention to rectify output of an AC generator.

FIG. 10 is a diagram showing a circuit configuration of an alternator using the semiconductor devices 200, 300 according to the first and second embodiments of the present invention to rectify output of a three-phase AC generator 801. The alternator 850 includes the AC generator 801 generating three-phase AC voltages Vu, Vv, Vw, having three output terminals 801u, 801v, 801w and the semiconductor devices 200 and 300 as rectifying elements for full-wave rectifying, and the capacitor 81 for smoothing. The output terminal 801u of the AC generator 801 is connected to a joint between the semiconductor devices 200 and 300 for U-phase. The output terminal 801v of the AC generator 801 is connected to a joint between the semiconductor devices 200 and 300 for V-phase. The output terminal 801w of the AC generator 801 is connected to a joint between the semiconductor devices 200 and 300 for W-phase. The alternator 850 outputs a DC output between the terminals 81p and 81m.

That is, the alternator 850 include a forward semiconductor device 200 comprising the semiconductor device 200 of which the one of the first internal electrode 14 and the second internal electrode 15 is the first internal electrode 14, and the reverse semiconductor device comprising the semiconductor device 300 of which the one of the first internal electrode and the second internal electrode is the second internal electrode 15; and the generator 801 generating an AC voltage, wherein the AC voltage is supplied between the forward semiconductor device and the reverse semiconductor device to generate a DC voltage.

In FIG. 10, the three-phase full-wave rectification circuit device 800 is provided for full-wave rectification. However, omission of some components in the three-phase full-wave rectification circuit device 800 can provide a half-wave rectifier. For example, the forward semiconductor device 200 for V-phase and the forward semiconductor device 200 for W-phase, the rearward semiconductor device 300 for U-phase, and rearward semiconductor device 300 for W-phase are omitted. In addition, the rearward semiconductor device 300 for V-phase can be omitted by short-circuiting between both terminal of the rearward semiconductor device 300 for V-phase. This provides a half-wave rectifier to output a DC voltage between the 81p and 81m.

A LIST OF REFERENCE NUMERALS 11 transistor circuit chip
11d drain electrode (first main terminal)
11s source electrode (second main terminal)
11g gate electrode
12 control circuit chip
13, 81 capacitor
14 drain frame (first internal electrode)
15 source frame (second internal electrode)
16 first resin (resin of electronic circuit body)
17 lead frame (support body)
18 wire
19 first conductive joint member (joint member of electronic circuit body)
21 base (first external electrode)
22 lead (second external terminal)
24 base seat (first electrode surface portion
25 lead header (second electrode surface portion)
26 second resin (resin for semiconductor device)
29 second conductive joint member (joint member for semiconductor device)
100 electronic circuit body
111 MOSFET
112, 123 diode
121 gate driver
122 comparator
200, 300 semiconductor device
800 three-phase full-wave rectification circuit device
801 generator
850 alternator

What is claimed is:
1. A semiconductor device, comprising:
a first external electrode including a first electrode surface portion;
a second external electrode including a second electrode surface portion; and
an electronic circuit body including:
a transistor circuit chip including a switching element;
a control circuit chip which controls the switching element;
a first internal electrode in contact with a first main surface of the transistor circuit chip; and
a second internal electrode in contact with a second main surface of the transistor circuit chip, wherein the electronic circuit body is disposed between the first external electrode and the second external electrode in a vertical direction of the semiconductor device, wherein the first electrode surface portion is connected to a first surface of the first internal electrode of the electronic circuit body, wherein the second electrode surface portion is connected to a second surface of the second internal electrode of the electronic circuit body, wherein the transistor circuit chip, the control circuit chip, the first internal electrode, and the second internal electrode are integrally covered with a resin, wherein one of the first internal electrode and the second internal electrode is connected with the first external electrode, and wherein the other one of the first internal electrode and the second internal electrode is connected with the second external electrode.

2. The semiconductor device according to claim 1, wherein the first electrode surface portion is connected through a first electrically conductive joint member to the first surface of the first internal electrode of the electronic circuit body, wherein the second electrode surface portion is connected through a second electrically conductive joint member to the second surface of the second internal electrode of the electronic circuit body, wherein one of the first internal electrode and the second internal electrode is connected through a third electrically conductive joint member and the first electrode surface portion to the first external electrode, and wherein the other one of the first internal electrode and the second internal electrode is connected through a fourth electrically conductive joint member and the second electrode surface portion to the second external electrode.

3. The semiconductor device according to claim 1, further comprising a capacitor for supplying a power source.

4. The semiconductor device according to claim 3, wherein the electronic circuit body includes the capacitor, wherein one of plural surfaces of the first internal electrode of the electronic circuit body is exposed from the first surface of the first internal electrode of the electronic circuit body, and wherein one of plural surfaces of the second internal electrode of the electronic circuit body is exposed from the second surface of the second internal electrode of the electronic circuit body.

5. The semiconductor device according to claim 1, wherein the resin being a first resin covers the electronic circuit body, and wherein a second resin covers the electronic circuit body, a surface of the first external electrode, and a surface of the second external electrode, the surface of the first external electrode and the surface of the second external electrode being on respective sides in contact with the electronic circuit body.

6. The semiconductor device according to claim 1, wherein thickness of the second internal electrode is larger than thickness of the first internal electrode.

7. An alternator comprising:
the semiconductor device according to claim 1; and
a generator which generates an AC voltage and is connected to the semiconductor device to output a DC voltage.

8. An alternator comprising:
a forward semiconductor device which is a semiconductor device according to claim 1, in which the one of the first internal electrode and the second internal electrode is the first internal electrode;
a reverse semiconductor device which is a semiconductor device according to claim 1, in which the one of the first internal electrode and the second internal electrode is the second internal electrode; and
a generator which generates an AC voltage and is connected to the forward or reverse semiconductor device to output a DC voltage.

* * * * *